(12) United States Patent
Liu

(10) Patent No.: US 11,315,995 B2
(45) Date of Patent: Apr. 26, 2022

(54) ORGANIC ELECTROLUMINESCENCE DEVICE

(71) Applicant: SHENZHEN CHINA STAR OPTOELECTRONICS SEMICONDUCTOR DISPLAY TECHNOLOGY CO., LTD., Guangdong (CN)

(72) Inventor: Ming Liu, Shenzhen (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 366 days.

(21) Appl. No.: 16/496,632

(22) PCT Filed: May 17, 2019

(86) PCT No.: PCT/CN2019/087367
§ 371 (c)(1),
(2) Date: Sep. 23, 2019

(87) PCT Pub. No.: WO2020/223999
PCT Pub. Date: Nov. 12, 2020

(65) Prior Publication Data
US 2021/0367180 A1  Nov. 25, 2021

(30) Foreign Application Priority Data

May 8, 2019 (CN) .......................... 201910378037.0

(51) Int. Cl.
*H01L 27/32* (2006.01)
*H01L 51/50* (2006.01)
(Continued)

(52) U.S. Cl.
CPC .......... *H01L 27/326* (2013.01); *H01L 25/048* (2013.01); *H01L 51/5092* (2013.01);
(Continued)

(58) Field of Classification Search
CPC . H01L 27/326; H01L 25/048; H01L 51/5092; H01L 51/52; H01L 2251/306; H01L 2251/564
See application file for complete search history.

(56) References Cited

U.S. PATENT DOCUMENTS

2003/0094612 A1* 5/2003 Yamazaki ........... H01L 27/3281
257/59
2004/0027059 A1* 2/2004 Tsutsui ................ H01L 51/5278
313/504
(Continued)

FOREIGN PATENT DOCUMENTS

JP           2001223088 A  *  8/2001

*Primary Examiner* — Aaron J Gray

(57) ABSTRACT

An organic electroluminescence device, which includes a transparent conductive layer, a light emitting unit layer, transparent insulator dielectric layer and an electrode layer which are stacked up layer by layer sequentially. The light emitting unit layer includes a first light emitting unit and a second light emitting unit which are arranged in juxtaposition and with an interval; through arranging the first light emitting unit and the second light emitting unit in juxtaposition and with an interval, making the organic electroluminescence device can be directly connected to external alternating current, not only can dispense from the energy dissipation causing by converting alternating current to direct current, but also can improve the luminous efficacy of the device; and makes the whole organic electroluminescence device be thin and light.

12 Claims, 6 Drawing Sheets

(51) Int. Cl.
*H01L 51/52* (2006.01)
*H01L 25/04* (2014.01)
(52) U.S. Cl.
CPC ........ *H01L 51/52* (2013.01); *H01L 2251/306* (2013.01); *H01L 2251/308* (2013.01); *H01L 2251/564* (2013.01)

(56) References Cited

U.S. PATENT DOCUMENTS

2006/0043410 A1\* 3/2006 Iwasaki .................. H05B 33/22 313/506
2008/0309234 A1\* 12/2008 Cho ..................... H05B 33/145 313/509

\* cited by examiner

ORGANIC ELECTROLUMINESCENCE DEVICE

FIELD OF INVENTION

The present disclosure relates to display field, particularly to an organic electroluminescence device driven by alternating current.

BACKGROUND OF INVENTION

Because an organic electroluminescence device has characteristics, such as adjustable photochromacity, high luminous efficacy and low cost, an organic electroluminescence (organic EL) device has very high potential. Organic light emitting diodes (OLEDs) are the most typical example, having been used in full color displays and surface illumination light sources. However, characteristics of the organic light emitting diode is necessary to be driven under direct current, and converting alternating current of daily family life from direct current will cause inevitable energy dissipation.

Therefore, it is necessary to provide an organic electroluminescence device driven by alternating current to overcome problems of prior art.

SUMMARY OF INVENTION

The purpose of the present disclosure is to provide an organic electroluminescence device able to directly connect to external alternating current, which can overcome the problem which the current organic electroluminescence device is not able to be directly driven by alternating current, and meanwhile is able to improve luminous efficacy of the device.

In order to solve problems mentioned above, the present disclosure provides an organic electroluminescence device, which includes a transparent conductive layer, a light emitting unit layer, a transparent insulator dielectric layer and an electrode layer which are stacked up layer by layer sequentially.

Specifically, the light emitting unit layer includes a first light emitting unit and a second light emitting unit which are arranged in juxtaposition and with an interval; the transparent insulator dielectric layer which is located on the transparent conductive layer and completely covers the light emitting unit layer; and the electrode layer includes a first electrode which is disposed oppositely to the first light emitting unit, and a second electrode which is disposed oppositely to the second light emitting unit. During applying, the first electrode is connected to one end of an alternating current (AC) power supply, the second electrode is connected to the other end of the AC power supply and are constituted into two sets of light emitting electric circuits; during a first half cycle when an AC signal has been switched on, the transparent conductive layer generates a plurality of electrons or a plurality of electron holes, and during another half cycle, the first light emitting unit and the second light emitting unit are simultaneously driven to emit lights.

Further, wherein the first light emitting unit and the second light emitting unit both include an electric charge injection layer, an electric charge transmission layer, a light emitting layer and an electron accumulation layer which are stacked layer by layer sequentially; specifically, the electric charge injection layer is located on the transparent conductive layer and electronically connected to the transparent conductive layer; the electric charge transmission layer is located on the electric charge injection layer; the light emitting layer is located on the electric charge transmission layer; the electron accumulation layer is located on the light emitting layer.

Further, wherein material of the transparent conductive layer includes indium tin oxide, which is prepared by a magnetron sputtering method.

Further, wherein material of the transparent insulator dielectric layer includes silicon dioxide, which is prepared by a chemical deposition method, and a thickness of the transparent insulator dielectric layer ranges from 20 nm to 1000 nm.

Further, wherein material of the first electrode and the second electrode includes an aluminum metal, which is prepared by a vacuum thermal evaporation method, and a thickness of the first electrode and the second electrode ranges from 100 nm to 200 nm.

Further, wherein material of the electric charge injection layer includes organic semiconductors, which is prepared by a vacuum thermal evaporation method, and a thickness of the electric charge injection layer ranges from 10 nm to 100 nm.

Further, wherein material of the electric charge transmission layer includes organic semiconductors, which is prepared by a vacuum thermal evaporation method, and a thickness of the electric charge transmission layer ranges from 10 nm to 200 nm.

Further, wherein material of the electron accumulation layer includes organic semiconductors, which is prepared by a vacuum thermal evaporation method, and a thickness of the electron accumulation layer ranges from 10 nm to 100 nm.

Further, wherein material of the light emitting layer includes organic semiconductors, which is prepared by a vacuum thermal evaporation method, and a thickness of the light emitting layer ranges from 10 nm to 100 nm.

Further, wherein a vacuum pressure of the vacuum thermal evaporation method is less than $5 \times 10^{-5}$ Pa.

The technical effect of the present disclosure is to provide an organic electroluminescence device, through arranging the first light emitting unit and the second light emitting unit in juxtaposition and with an interval, making the organic electroluminescence device can be directly connected to external alternating current, and the electronics and the electron holes generated from the transparent conductive layer connected to external alternating current are directly controlled by alternating current, and the injecting ability of the electronics and the electron holes of alternating current is powerful; therefore not only can dispense from the energy dissipation causing by converting alternating current to direct current, but also can improve the luminous efficacy of the device. Moreover, the first light emitting unit and the second light emitting unit which are arranged in juxtaposition and with an interval make the whole organic electroluminescence device be thin and light.

DETAILED DESCRIPTION OF PREFERRED EMBODIMENTS

In the present disclosure, unless expressly specified or limited otherwise, a first feature is "on" or "beneath" a second feature may include that the first feature directly contacts the second feature and may also include that the first feature does not directly contact the second feature. Furthermore, a first feature "on," "above," or "on top of" a second feature may include an embodiment in which the first feature is right "on," "above," or "on top of" the second feature and may also include that the first feature is not right "on," "above," or "on top of" the second feature, or just means that the first feature has a sea level elevation greater than the sea level elevation of the second feature. While first feature "beneath," "below," or "on bottom of" a second feature may include that the first feature is "beneath," "below," or "on bottom of" the second feature and may also include that the first feature is not right "beneath," "below," or "on bottom of" the second feature, or just means that the first feature has a sea level elevation less than the sea level elevation of the second feature.

In the present disclosure, the same or corresponding components are used the same labels of the accompanying figures to indicate and are unrelated to the figure numbers, and through the specification, when "first", "second" and the like can be used to indicate various components, these components are not limited to above terms. The terms mentioned above is only for distinguishing one component to another component.

Figure 1:
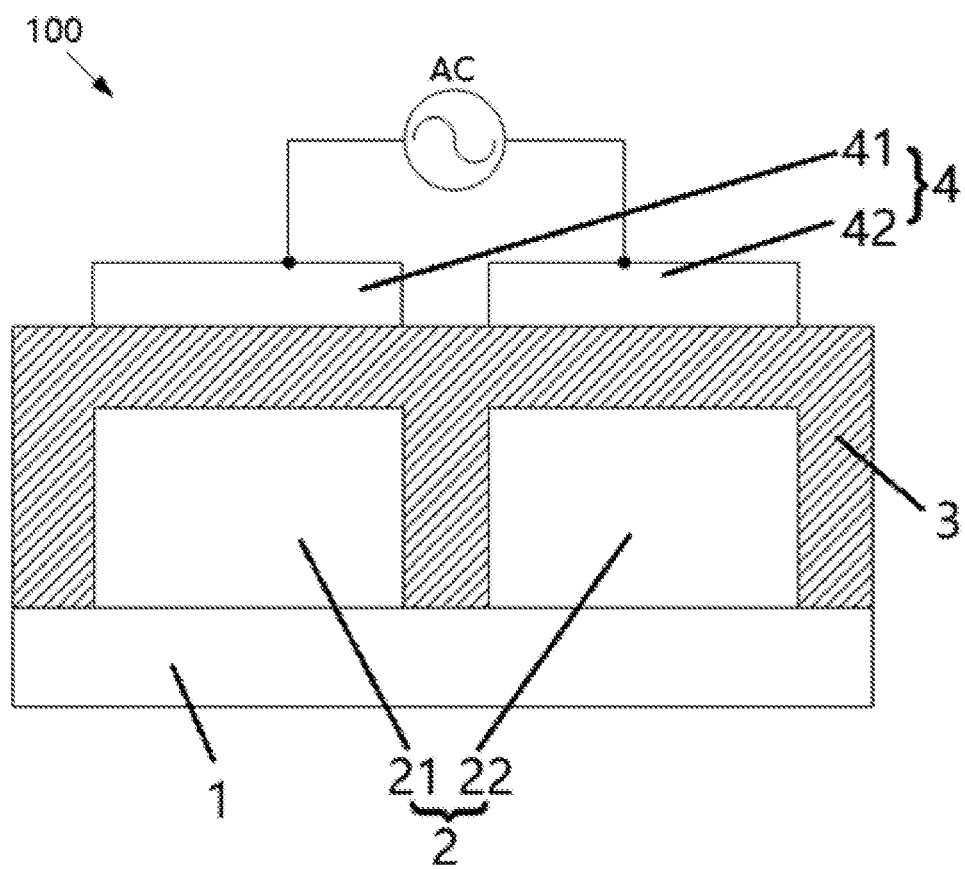
FIG. 1 is a structural schematic diagram of an organic electroluminescence device of an embodiment of the present disclosure.

Please refer to FIG. 1, the present disclosure provides an organic electroluminescence device 100, which includes a transparent conductive layer 1, a light emitting unit layer 2, a transparent insulator dielectric layer 3 and an electrode layer 4 which are stacked up layer by layer sequentially. Specifically, the light emitting unit layer 2 includes a first light emitting unit 21 and a second light emitting unit 22 which are arranged in juxtaposition and with an interval; the transparent insulator dielectric layer 3 which is located on the transparent conductive layer 1 and completely covers the light emitting unit layer 2; and the electrode layer 4 includes a first electrode 41 which is disposed oppositely to the first light emitting unit 21, and a second electrode 42 which is disposed oppositely to the second light emitting unit 22.

During applying, the first electrode 41 is connected to one end of an alternating current (AC) power supply, the second electrode 42 is connected to the other end of the AC power supply and are constituted into two sets of light emitting electric circuits: constituting one set of the light emitting electric circuits through the transparent conductive layer 1, the first light emitting unit 21, the transparent insulator dielectric layer 3 and the first electrode 41; constituting another set of the light emitting electric circuits through the transparent conductive layer 1, the second light emitting unit 22, the transparent insulator dielectric layer 3 and the second electrode 42. During a first half cycle when an AC signal has been switched on, the transparent conductive layer 1 generates a plurality of electrons or a plurality of electron holes, and during another half cycle of the AC signal, the first light emitting unit 21 and the second light emitting unit 22 are simultaneously driven to emit light.

Figure 2:
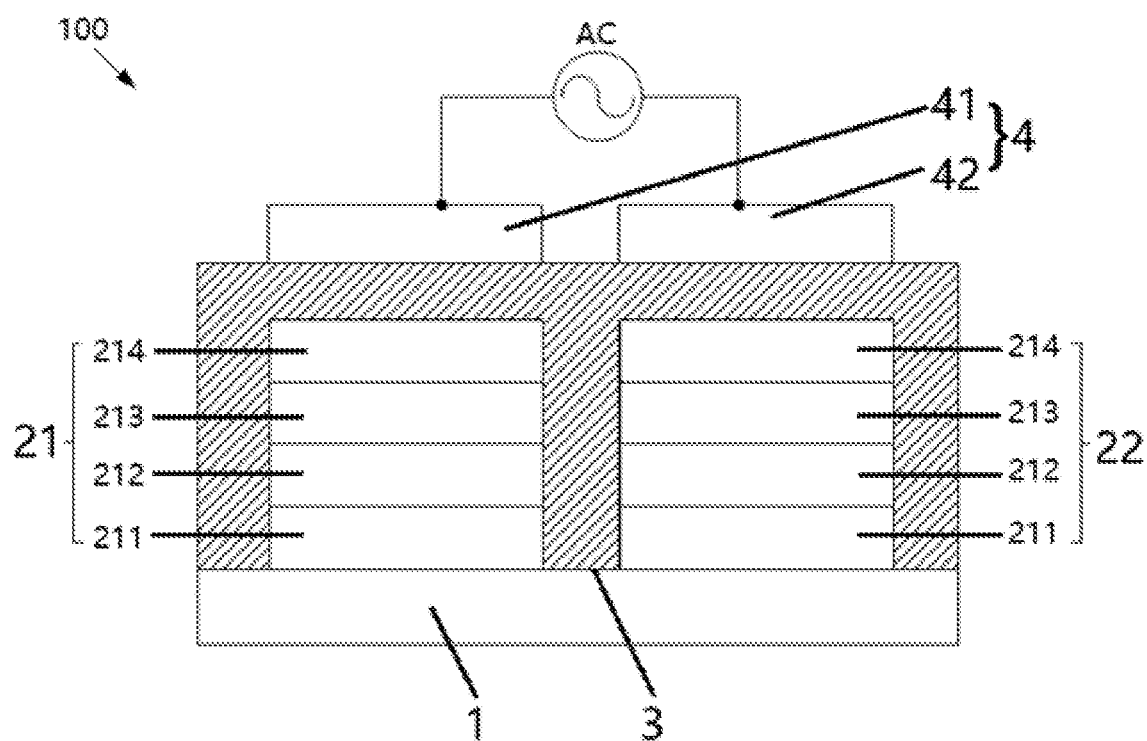
FIG. 2 is a schematic diagram of an organic electroluminescence device of another embodiment of the present disclosure.

Please refer to FIG. 2, the first light emitting unit 21 and the second light emitting unit 22 both include an electric charge injection layer 211, an electric charge transmission layer 212, a light emitting layer 213 and an electron accumulation layer 214 which are stacked layer by layer sequentially; specifically, the electric charge injection layer 211 is located on the transparent conductive layer 1 and electronically connected to the transparent conductive layer 1; the electric charge transmission layer 212 is located on the electric charge injection layer 211; the light emitting layer 213 is located on the electric charge transmission layer 212; the electron accumulation layer 214 is located on the light emitting layer 213.

Figure 3:
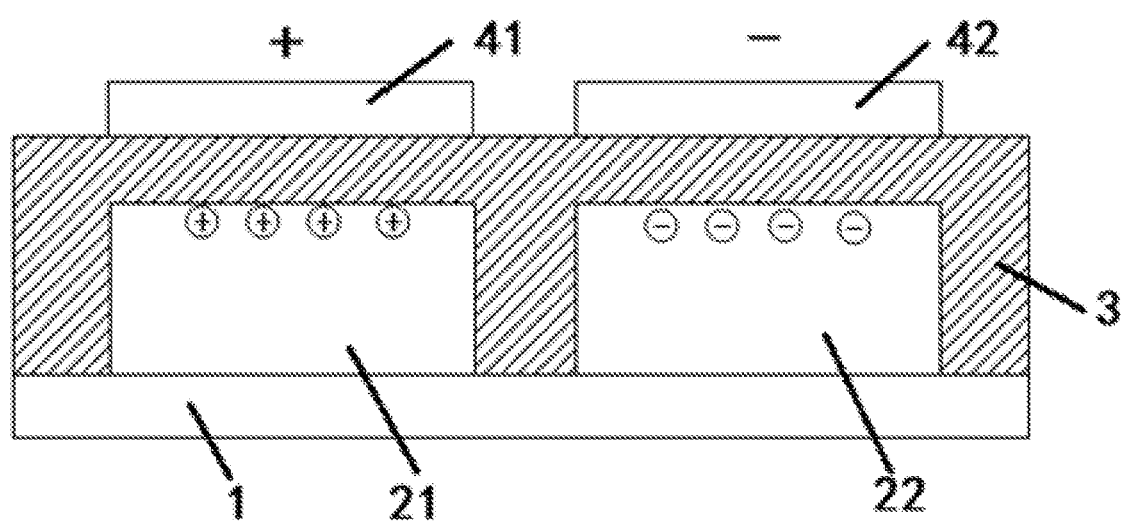
FIG. 3 is a schematic diagram of the first half cycle of the organic electroluminescence device light emitting theory of an embodiment of the present disclosure.
Figure 4:
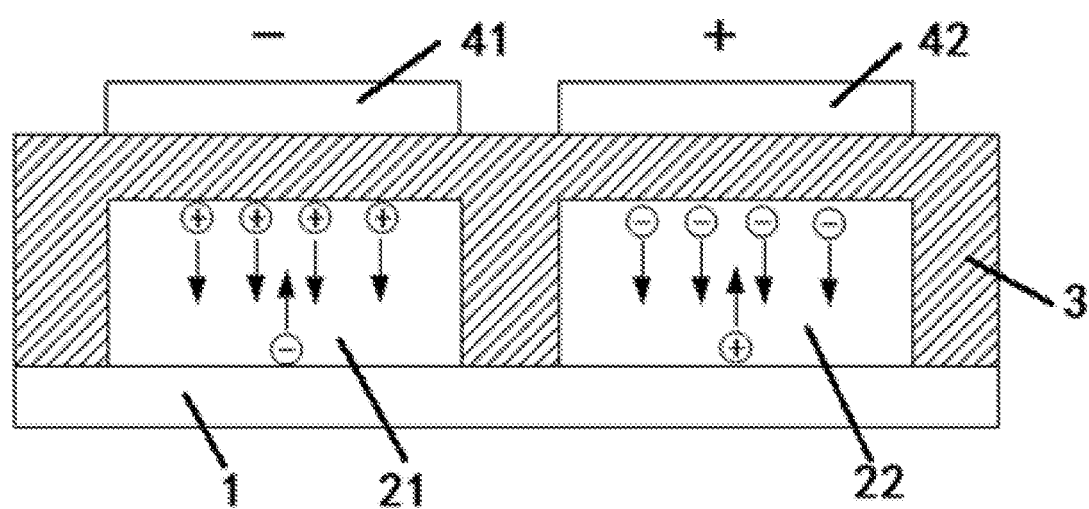
FIG. 4 is a schematic diagram of the second half cycle of the organic electroluminescence device light emitting theory of an embodiment of the present disclosure.
Figure 5:
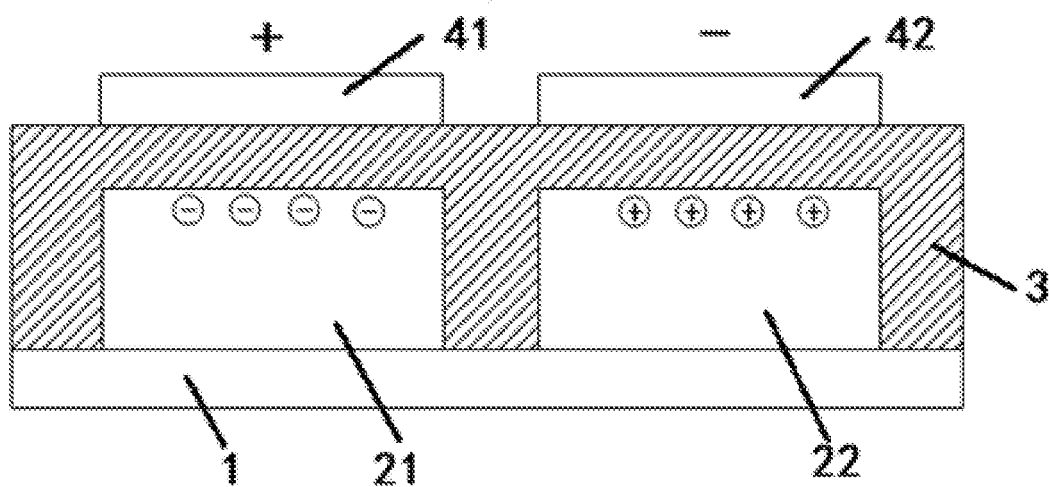
FIG. 5 is a schematic diagram of the finished second half cycle of the organic electroluminescence device light emitting theory of an embodiment of the present disclosure.

During applying, the first electrode 41 and the second electrode 42 are applied with the opposite polarity of the alternating voltage, the specific theory please refer to FIG. 3 to FIG. 5.

As illustrated in FIG. 3, the first electrode 41 connected to a negative electrode and the second electrode 42 connected to a positive electrode are the first half cycle of an AC signal having been switched on. The transparent conductive layer 1 which is corresponding to the first electrode 41 generates positive electrical charges by the induction of the electric field, and the positive electrical charges move to the electron accumulation layer 214 and gradually accumulate. Meanwhile, the transparent conductive layer 1 which is corresponding to the first electrode 42 generates negative electrical charges by the induction of the electric field, and the negative electrical charges move to the electron accumulation layer 214 and gradually accumulate. At this time, due to it is the first half cycle during the AC signal having been switched on, the light emitting unit layer 2 where the first light emitting unit 21 and the second light emitting unit 22 are arranged in juxtaposition and with an interval does not emit light.

As illustrated in FIG. 4 and FIG. 5, during the second half cycle of an AC signal having been switched on, the first electrode 41 is connected to a positive electrode and the second electrode 42 is connected to a negative electrode, that is the polarity of the second half cycle is opposite to the first half cycle; in the first light emitting unit 21, the transparent conductive layer 1 corresponding to the first electrode 41 generates negative electrical charges by the induction of the electric field, and the negative electrical charges move to the upper surface of the first light emitting unit 21 (where the electron accumulation layer 214 is), and at this time positive electrical charges located on the upper surface of the first light emitting unit 21 (where the electron accumulation layer 214 is) move to the direction of the transparent conductive layer 1, finally the negative electrical charges and the positive electrical charges meet together in the light emitting layer 213 and from into excitons and radiate to emit light (theory of organic light emitting material) to make the light emitting layer 213 be lit up. Meanwhile in the second light emitting unit 22, the transparent conductive layer 1 corresponding to the second light emitting unit 42 generates positive electrical charges by the induction of the electric field, and the positive electrical charges move to the upper surface of the first light emitting unit 21 (where the electron accumulation layer 214 is), and at this time negative electrical charges located on the upper surface of the first light emitting unit 21 (where the electron accumulation layer 214 is) move to the direction of transparent conductive layer 1, finally the positive electrical charges and the negative electrical charges meet together and from into excitons in the light emitting layer 213 and radiate to emit light (theory of organic light emitting material) to make the light emitting layer 213 be lit up. After the light emitting process finished, because the first electrode 41 is connected to a positive electrode and the second electrode 42 is connected to a negative electrode, and the transparent conductive layer 1 corresponding to the first electrode 41 continues generating negative electrical charges by the induction of the electric field, and the negative electrical charges move to the upper surface of the first light emitting unit 21 (where the electron accumulation layer 214 is) and gradually accumulate, meanwhile the transparent conductive layer 1 corresponding to the second electrode 42 continues generating positive electrical charges by the induction of the electric field, and the positive electrical charges move to the upper surface of the first light emitting unit 21 (where the electron accumulation layer 214 is) and gradually accumulate.

Figure 6:
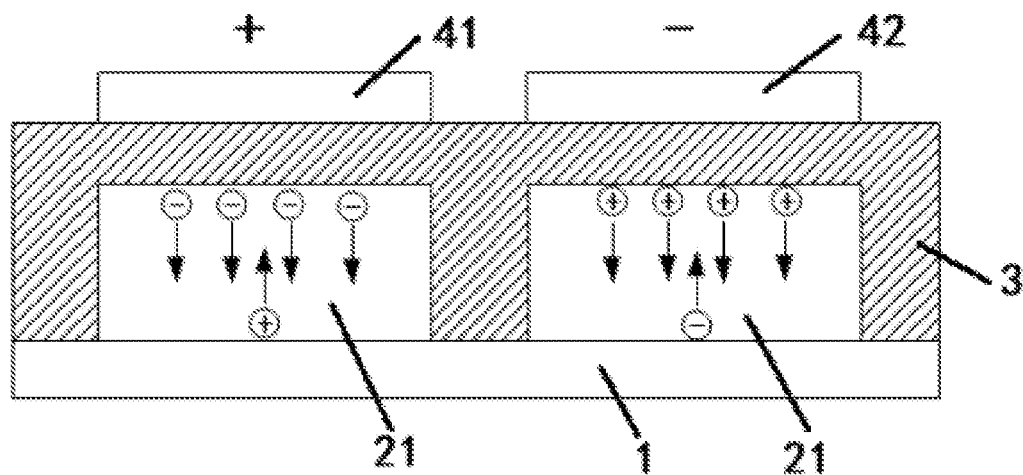
FIG. 6 is a schematic diagram of the third half cycle of the organic electroluminescence device light emitting theory of an embodiment of the present disclosure.

As illustrated in FIG. 6, during the third half cycle of an AC signal having been switched on, the first electrode 41 is connected to a negative electrode and the second electrode 42 is connected to a positive electrode, that is the polarity of the third half cycle is opposite to the second half cycle; in the first light emitting unit 21, the transparent conductive layer 1 corresponding to the first electrode 41 generates positive electrical charges by the induction of the electric field, and the positive electrical charges move to the upper surface of the first light emitting unit 21 (where the electron accumulation layer 214 is), and at this time negative electrical charges located on the upper surface of the first light emitting unit 21 (where the electron accumulation layer 214 is) move to the direction of the transparent conductive layer 1, finally the positive electrical charges and the negative electrical charges meet together in the light emitting layer 213 and from into excitons and radiate to emit light (theory of organic light emitting material) to make the light emitting layer 213 be lit up. Meanwhile in the second light emitting unit 22, the transparent conductive layer 1 corresponding to the second light emitting unit 42 generates negative electrical charges by the induction of the electric field, and the negative electrical charges move to the upper surface of the first light emitting unit 21 (where the electron accumulation layer 214 is), and at this time positive electrical charges located on the upper surface of the first light emitting unit 21 (where the electron accumulation layer 214 is) move to the direction of the transparent conductive layer 1, finally the negative electrical charges and the positive electrical charges meet together in the light emitting layer 213 and from into excitons and radiate to emit light (theory of organic light emitting material) to make the light emitting layer 213 be lit up. After the light emitting process finished, because the first electrode 41 is connected to a negative electrode and the second electrode 42 is connected to a positive electrode, and the transparent conductive layer 1 corresponding to the first electrode 41 continues generating positive electrical charges by the induction of the electric field, and the positive electrical charges move to the upper surface of the first light emitting unit 21 (where the electron accumulation layer 214 is) and gradually accumulate, meanwhile the transparent conductive layer 1 corresponding to the second electrode 42 continues generating negative electrical charges by the induction of the electric field, and the negative electrical charges move to the upper surface of the first light emitting unit 21 (where the electron accumulation layer 214 is) and gradually accumulate. As the reciprocating loops, the light emitting 213 is lit up twice in a cycle of the AC signal, that is the first light emitting unit 21 and the second light emitting unit 22 which are located in the light emitting unit layer 2 being lit up twice.

In summary, during applying, the first electrode 41 and the second electrode 42 are applied with the opposite polarities of the alternating voltage, during one of half cycles of the AC signal, the transparent conductive layer 1 generates a plurality of electrons or a plurality of electron holes, and during another half cycle of the AC signal, through effect of the electric field, the transparent conductive layer 1 generates a plurality of electrons or a plurality of electron holes which are opposite to the previous half cycle, thereby making the light emitting layer 213 be lit up, that is the first light emitting unit 21 and the second light emitting unit 22 are simultaneously driven to emit light.

Generally, the frequency of the AC signal of mains supply is 50 Hz, and the excited frequency of the light emitting layer of the above-mentioned light emitting units is far below 50 Hz. The highest frequency able to be recognized by people's eyes is 24 Hz, that is, to react once requires 0.042 s, therefore using the 50 Hz alternating current to drive the organic electroluminescence device 100 can get a non-stroboscopic effect.

In this embodiment, material of the transparent conductive layer 1 includes indium tin oxide, which is prepared by a magnetron sputtering method.

In this embodiment, material of the transparent insulator dielectric layer 3 includes silicon dioxide, which is prepared by a chemical deposition method, and a thickness of the transparent insulator dielectric layer ranges from 20 nm to 1000 nm.

In this embodiment, material of the first electrode 41 and the second electrode 42 includes an aluminum metal, which is prepared by a vacuum thermal evaporation method, and a thickness of the first electrode and the second electrode ranges from 100 nm to 200 nm. The first electrode 41 and the second electrode 42 can reflect light, and the first electrode 41 is disposed oppositely to the first light emitting unit 21, the second electrode 42 is disposed oppositely to the second light emitting unit 22, making the light emitted from the first light emitting unit 21 and the second light emitting unit 22 are through reflected and then emitted on the same side.

In this embodiment, material of the electric charge injection layer 211 includes organic semiconductors, which is prepared by a vacuum thermal evaporation method, and a thickness of the electric charge injection layer ranges from 10 nm to 100 nm.

In this embodiment, material of the electric charge transmission layer 212 includes organic semiconductors, which is prepared by a vacuum thermal evaporation method, and a thickness of the electric charge transmission layer ranges from 10 nm to 200 nm.

In this embodiment, the light emitting layer 213 includes organic semiconductors, which is prepared by a vacuum thermal evaporation method, and a thickness of the light emitting layer ranges from 10 nm to 100 nm.

In other embodiment, the light emitting layer 213 is applied one or more of organic light emitting material, inorganic light emitting material, organic and inorganic hybridization light emitting material.

It is worth mentioning that material applied by the light emitting layer 213 of the first light emitting unit 21 and the light emitting layer 213 of the second light emitting unit 22 can be same or different; therefore the light emitting colors of the first light emitting unit 21 and the second light emitting unit 22 can be same or different. In other embodiment, the first light emitting unit 21 emits a blue light, the second light emitting unit 22 emits a red light, through an alternating current rapidly swaps between a positive voltage and a negative voltage, making the two color light emitting strips of the first light emitting unit 21 and the second light emitting unit 22 shine alternately, and it is difficult for people's eye to recognize bright and dark in the short time, and a white light can be realized by a combination of a blue light and a red light.

In this embodiment, material of the electron accumulation layer 214 includes organic semiconductors, which is prepared by a vacuum thermal evaporation method, and a thickness of the electric charge injection layer ranges from 10 nm to 100 nm.

In this embodiment, a vacuum pressure of the vacuum thermal evaporation method is less than $5 \times 10^{-5}$ Pa.

The advantage of the present disclosure is to provide an organic electroluminescence device, through arranging the first light emitting unit and the second light emitting unit in juxtaposition and with an interval, making the organic electroluminescence device can be directly connected to external alternating current, and the electronics and the electron holes generated from the transparent conductive layer connected to external alternating current are directly controlled by alternating current, and the injecting ability of the electronics and the electron holes of the alternating current is powerful; therefore not only can dispense from the energy dissipation causing by converting alternating current to direct current, but also can improve the luminous efficacy of the device. Moreover, the first light emitting unit and the second light emitting unit which are arranged in juxtaposition and with an interval make the whole organic electroluminescence device be thin and light.

Which mentioned above is preferred embodiments of the present disclosure, it should be noted that to those skilled in the art without departing from the technical theory of the present disclosure, can further make many changes and modifications, and the changes and the modifications should be considered as the scope of protection of the present disclosure.

What is claimed is:

1. An organic electroluminescence device, comprising:
a transparent conductive layer;
a light emitting unit layer which is located on the transparent conductive layer, and the light emitting unit layer comprises a first light emitting unit and a second light emitting unit which are arranged in juxtaposition and with an interval;
a transparent insulator dielectric layer which is located on the transparent conductive layer and completely covers the light emitting unit layer; and
an electrode layer which is located on the transparent insulator dielectric layer, and the electrode layer comprises:
a first electrode which is disposed oppositely to the first light emitting unit;
a second electrode which is disposed oppositely to the second light emitting unit;
wherein the first light emitting unit and the second light emitting unit both comprise:
an electric charge injection layer located on the transparent conductive layer and is electrically connected to the transparent conductive layer;
an electric charge transmission layer located on the electric charge injection layer;
a light emitting layer located on the electric charge transmission layer; and
an electron accumulation layer located on the light emitting layer; and
wherein during applying, the first electrode is connected to one end of an alternating current (AC) power supply, the second electrode is connected to the other end of the AC power supply and are constituted into two sets of light emitting electric circuits; during a first half cycle when an AC signal has been switched on, the transparent conductive layer generates a plurality of electrons or a plurality of electron holes, and during another half cycle, the first light emitting unit and the second light emitting unit are simultaneously driven to emit lights.

2. The organic electroluminescence device as claimed in claim 1, wherein material of the transparent conductive layer comprises indium tin oxide, which is prepared by a magnetron sputtering method.

3. The organic electroluminescence device as claimed in claim 1, wherein material of the transparent insulator dielectric layer comprises silicon dioxide, which is prepared by a chemical deposition method, and a thickness of the transparent insulator dielectric layer ranges from 20 nm to 1000 nm.

4. The organic electroluminescence device as claimed in claim 1, wherein material of the first electrode and the second electrode comprises an aluminum metal, which is prepared by a vacuum thermal evaporation method, and a thickness of the first electrode and the second electrode ranges from 100 nm to 200 nm.

5. The organic electroluminescence device as claimed in claim 1, wherein material of the electric charge injection layer comprises organic semiconductors, which is prepared by a vacuum thermal evaporation method, and a thickness of the electric charge injection layer ranges from 10 nm to 100 nm.

6. The organic electroluminescence device as claimed in claim 1, wherein material of the electric charge transmission layer comprises organic semiconductors, which is prepared by a vacuum thermal evaporation method, and a thickness of the electric charge transmission layer ranges from 10 nm to 200 nm.

7. The organic electroluminescence device as claimed in claim 1, wherein material of the electron accumulation layer comprises organic semiconductors, which is prepared by a vacuum thermal evaporation method, and a thickness of the electron accumulation layer ranges from 10 nm to 100 nm.

8. The organic electroluminescence device as claimed in claim 1, wherein material of the light emitting layer comprises organic semiconductors, which is prepared by a vacuum thermal evaporation method, and a thickness of the light emitting layer ranges from 10 nm to 100 nm.

9. The organic electroluminescence device as claimed in claim 5, wherein a vacuum pressure of the vacuum thermal evaporation method is less than $5 \times 10^{-5}$ Pa.

10. The organic electroluminescence device as claimed in claim 6, wherein a vacuum pressure of the vacuum thermal evaporation method is less than $5 \times 10^{-5}$ Pa.

11. The organic electroluminescence device as claimed in claim 7, wherein a vacuum pressure of the vacuum thermal evaporation method is less than $5 \times 10^{-5}$ Pa.

12. The organic electroluminescence device as claimed in claim 8, wherein a vacuum pressure of the vacuum thermal evaporation method is less than $5 \times 10^{-5}$ Pa.

* * * * *